United States Patent
Maertz et al.

(10) Patent No.: US 10,559,744 B2
(45) Date of Patent: Feb. 11, 2020

(54) TEXTURE BREAKING LAYER TO DECOUPLE BOTTOM ELECTRODE FROM PMTJ DEVICE

(71) Applicant: Intel Corporation, Santa Clara, CA (US)

(72) Inventors: Brian Maertz, Santa Barbara, CA (US); Christopher J. Wiegand, Portland, OR (US); Daniel G. Oeullette, Portland, OR (US); Md Tofizur Rahman, Portland, OR (US); Oleg Golonzka, Beaverton, OR (US); Justin S. Brockman, Portland, OR (US); Tahir Ghani, Portland, OR (US); Brian S. Doyle, Portland, OR (US); Kevin P. O'Brien, Portland, OR (US); Mark L. Doczy, Beaverton, OR (US); Kaan Oguz, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/072,301

(22) PCT Filed: Apr. 1, 2016

(86) PCT No.: PCT/US2016/025709
§ 371 (c)(1),
(2) Date: Jul. 24, 2018

(87) PCT Pub. No.: WO2017/171869
PCT Pub. Date: Oct. 5, 2017

(65) Prior Publication Data
US 2019/0036010 A1 Jan. 31, 2019

(51) Int. Cl.
*H01L 43/02* (2006.01)
*H01L 43/08* (2006.01)
(Continued)

(52) U.S. Cl.
CPC ............ *H01L 43/02* (2013.01); *H01L 27/228* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS 6,770,382 B1 * 8/2004 Chang .................... B82Y 10/00
                                                        360/313
8,329,478 B2   12/2012 Shi et al.
(Continued)

FOREIGN PATENT DOCUMENTS

| CN | 102435960 | 5/2012 |
| KR | 10-2011-0038419 | 4/2011 |
| KR | 10-2013-0015927 | 2/2013 |

OTHER PUBLICATIONS

International Preliminary Report on Patentability for International Patent Application No. PCT/US16/25709, dated Oct. 11, 2018, 9 pages.
(Continued)

*Primary Examiner* — Benjamin P Sandvik
(74) *Attorney, Agent, or Firm* — Schwabe, Williamson & Wyatt P.C.

(57) ABSTRACT

An apparatus including an array of memory cells arranged in a grid defined by word lines and bit lines in a generally orthogonal orientation relative to one another, a memory cell including a resistive memory component and an access transistor, wherein the access transistor includes a diffusion region disposed at an acute angle relative to an associated word line. A method including etching a substrate to form a plurality of fins each including a body having a length dimension including a plurality of first junction regions and a plurality of second junction regions that are generally (Continued)

parallel to one another and offset by angled channel regions displacing in the length dimension an end of a first junction region from the beginning of a second junction region; removing the spacer material; and introducing a gate electrode on the channel region of each of the plurality of fins.

17 Claims, 5 Drawing Sheets

(51) Int. Cl.
*H01L 43/10* (2006.01)
*H01L 43/12* (2006.01)
*H01L 27/22* (2006.01)

(56) References Cited

U.S. PATENT DOCUMENTS

| | | | |
|---|---|---|---|
| 8,593,863 B2 | 11/2013 | Choi | |
| 2002/0009616 A1* | 1/2002 | Kamiguchi | B82Y 10/00 428/811 |
| 2012/0068698 A1 | 3/2012 | Chen et al. | |
| 2013/0015539 A1* | 1/2013 | Choi | H01L 43/08 257/421 |
| 2013/0313665 A1* | 11/2013 | Rhie | G11C 11/16 257/421 |
| 2014/0084398 A1* | 3/2014 | Oguz | H01L 43/12 257/421 |
| 2014/0145277 A1* | 5/2014 | Chien | H01L 43/08 257/421 |
| 2014/0340957 A1 | 11/2014 | Wang et al. | |
| 2015/0076634 A1* | 3/2015 | Chien | H01L 43/08 257/421 |

OTHER PUBLICATIONS

International Search Report and Written Opinion for International Patent Application No. PCT/US2016/025709 dated Dec. 27, 2016, 12 pgs.

* cited by examiner

TEXTURE BREAKING LAYER TO DECOUPLE BOTTOM ELECTRODE FROM PMTJ DEVICE

CROSS-REFERENCE TO RELATED APPLICATION

This patent application is a U.S. National Phase Application under 35 U.S.C. § 371 of International Application No. PCT/US2016/025709, filed Apr. 1, 2016, entitled "TEXTURE BREAKING LAYER TO DECOUPLE BOTTOM ELECTRODE FROM PMTJ DEVICE," which designates the United States of America, the entire disclosure of which is hereby incorporated by reference in its entirety and for all purposes.

BACKGROUND

Field

Magnetic tunnel junction (MTJ) memory devices.

Description of Related Art

A magnetic tunnel junction (MTJ) memory device generally includes an array of memory cells each of which is typically constructed of two layers of magnetic material separated by dielectric layer. The magnetization of one of the magnetic layers is alterable and the magnetization of the other layer is fixed or "pinned" in a particular direction. The magnetic layer having alterable magnetization is typically referred to as a data storage layer and the magnetic layer which is pinned is typically referred to as a reference layer. Conductive traces are often routed across the array of memory cells as word lines and bit lines oriented perpendicular to each other. Located at each intersection of a word line and a bit line, each memory cell stores a bit of information as an orientation of a magnetization.

Magnetoresistive random access memory (MRAM) is of non-volatile memory that stores data in the form of magnetic storage elements such as MTJ memory cells. In a MRAM operation, the pinned magnet is set to a particular polarity while the magnetic fields of the alterable magnet can be changed to match that of an external field to store memory. Representatively, a cell containing such magnetic storage may be selected by powering an associated transistor that switches its current from a supply line through the cell to ground. Due to a magnetic time effect, an electrical resistance of the cell changes due to an orientation of the field in the two magnets. By measuring a resulting current, a resistance inside of a particular cell can be determined (the cell can be read).

Spin transfer torque (STT) MRAM uses spin-aligned electrons to influence electrons flowing into a layer to change their spin. Where a current is passed through a magnetization layer of an MTJ device or cell (the fixed magnetic layer) the current will come out spin polarized. With the passing of each electron, its spin (angular momentum) will be transferred to the magnetization in the free magnetic layer and will cause a change to its magnetization. This is, in effect, a torque-causing precession of magnetization. Due to reflection of electrons, a torque is also exerted on the magnetization of an associated fixed magnetic layer. In the end, if the current exceeds a certain critical value (given by damping caused by the magnetic material and its environment), the magnetization of the free magnetic layer will be switched by a pulse of current typically in about one to 10 nanoseconds. Magnetization of the fixed magnetic layer may remain unchanged since an associated current is below its threshold due to geometry or due to an adjacent anti-ferromagnetic layer. STT-MRAM has the advantages of lower power consumption and better scalability over conventional MRAM which uses magnetic fields to flip the active elements.

DETAILED DESCRIPTION

A magnetic tunneling junction (MTJ) device is disclosed that is operable for use in an memory devices including, but not limited to, MRAM and STT-MRAM devices including an embedded memory, embedded non-volatile memory (MVM) and non-embedded or stand alone memory. In one embodiment, the MTJ device uses a buffer layer between the fixed or pinned magnetic layer and an electrode to decouple a propagation of the electrode crystallization or texture into the MTJ device. By decoupling a crystallization or texture of an electrode from the fixed or pinned magnetic layer, the fixed magnetic layer maintains its fixed or pinned position thus providing improved perpendicular magnetic anisotropic.

Figure 1:
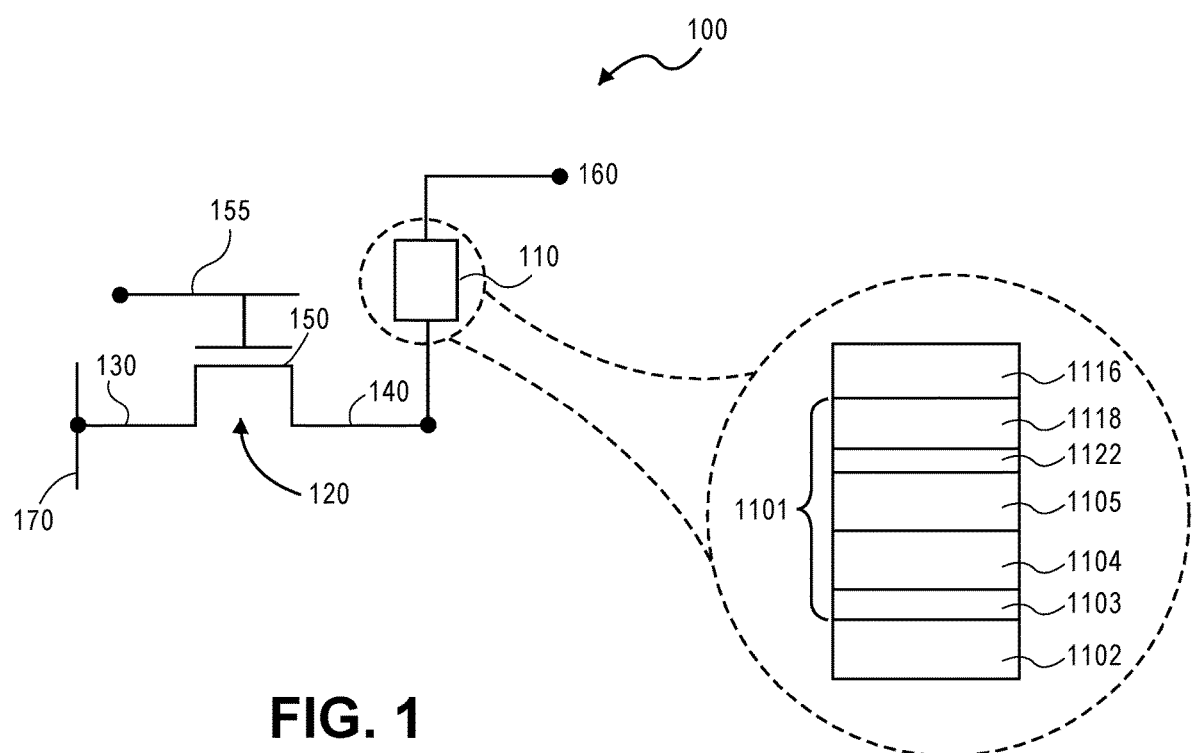
FIG. 1 illustrates a schematic of a STT-MRAM memory bit cell.

FIG. 1 illustrates a schematic of a non-volatile memory bit cell that is an STT-MRAM memory bit cell. In this embodiment, bit cell 100 includes STT-MRAM memory element or component 110. As shown in the inset, where STT-MRAM memory component 110 is a spin transfer torque element including an MTJ device, such element representatively includes a perpendicular MTJ device 1101 between bottom electrode 1102 and top electrode 1116. Disposed on bottom electrode 1102 is buffer layer 1103. Disposed on buffer layer 1103 is synthetic antiferromagnetic (SAF) layer 104. A material for SAF layer 104 includes, but is not limited to, platinum and cobalt with ruthenium or rhodium. Disposed on SAF layer 1104 is fixed magnetic layer 1105 of, for example, cobalt-iron-boron (CoFeB). Disposed on fixed magnetic layer 1105 is tunneling barrier or dielectric layer 1122 of, for example, magnesium oxide (MgO). Disposed on dielectric layer 1122 is free magnetic layer 1118 of, for example, CoFeB. Finally, disposed on free magnetic layer 1118 is top electrode 1116.

As noted above, buffer layer 1103 is disposed between bottom electrode 1102 and SAF layer 1104. In one embodiment, buffer layer 1103 is a material having a property that inhibits a propagation of a crystalline structure or texture of bottom electrode 1102 into SAF layer 1104 and into fixed magnetic layer 1105. By inhibiting the propagation of a crystalline structure or texture of the bottom electrode through the MTJ device to the fixed magnetic layer of MTJ device 1101, the fixed magnetic layer has less tendency to move (i.e., change magnetization) and a greater tendency to remain fixed or pinned. A suitable material for buffer layer 1103 is an oxidized aluminum layer. Representatively, an oxidized aluminum layer has a representative thickness on the order of three angstroms (Å) to 10 Å, such as 5 Å.

STT-MRAM memory component 110 is connected to bit line 160. Top electrode 1116 may be electrically connected to bit line 160. STT-MRAM memory component 110 is also connected to access transistor 120 associated with bit cell 100. Access transistor 120 includes a diffusion region including junction region 130 (source), junction region 140 (drain), a channel region between or separating the junction regions and gate electrode 150 on the channel region. As illustrated, STT-MRAM memory component 110 is connected to junction region 140 of access transistor 120. Bottom electrode 1102 is connected to the junction region. Junction region 130 in bit cell 100 is connected to source line 170. Finally, gate electrode 150 is electrically connected to word line 155.

Figure 2:
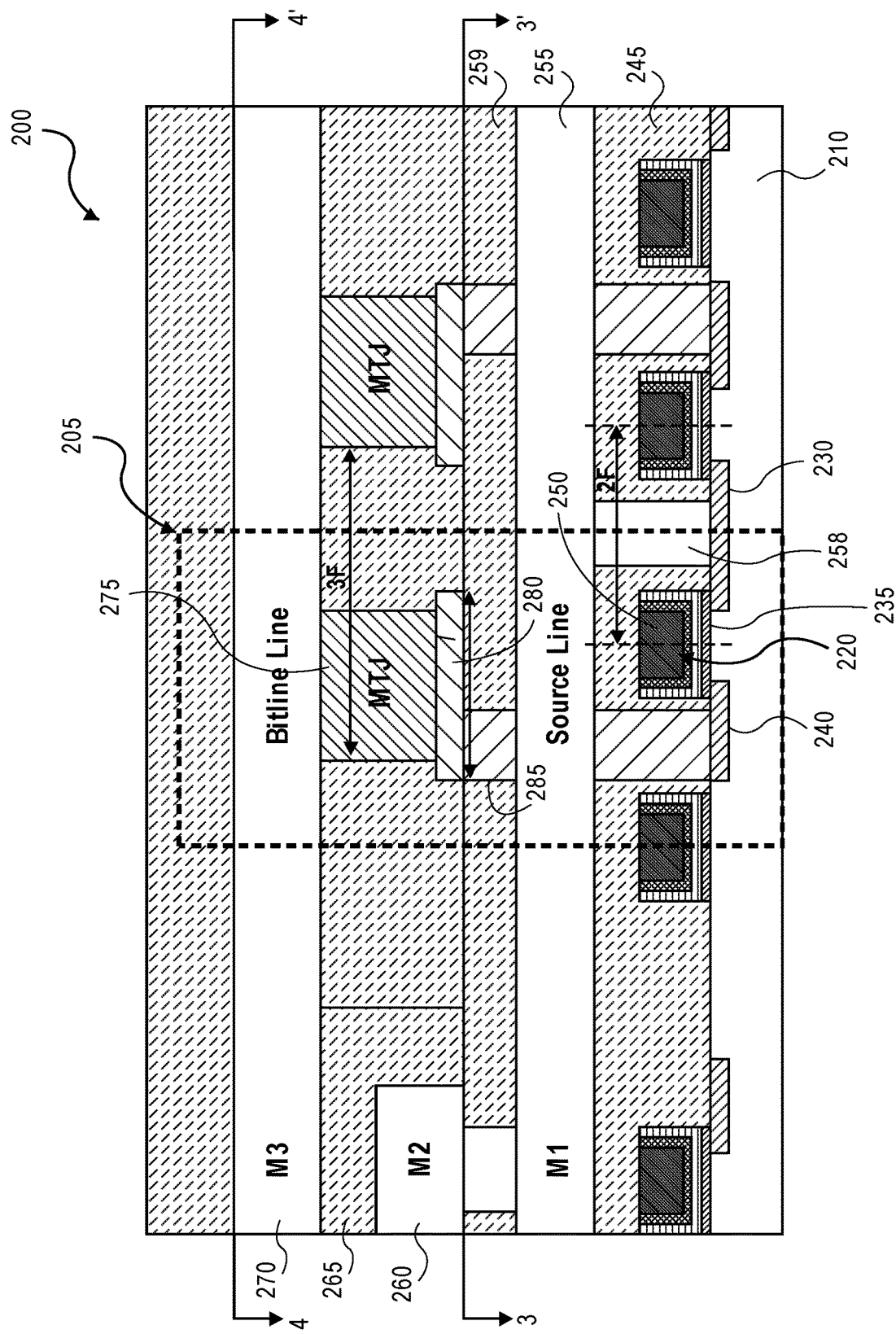
FIG. 2 shows a cross-sectional side view of a portion of an integrated circuit substrate including a number of STT-MRAM memory bit cells.

FIG. 2 shows a cross-sectional side view of a portion of an integrated circuit substrate including a number of STT-MRAM memory bit cells. In one embodiment, the integrated circuit structure is a memory device built of a grid of STT-MRAM memory cells. Referring to FIG. 2, structure 200 includes substrate 210 of, for example, a single crystal semiconductor material such as silicon. Substrate 210 has a number of devices formed thereon including transistor devices represented by transistor 220. Such transistors may be, for example, a single gate or multi-gate device or both. As illustrated, transistor 220 includes a diffusion region including junction region 230 (source) and junction region 240 (drain) and channel 235 between the junction regions. Transistor 220 also includes gate electrode 250 of, for example, a polysilicon material, a metal material or a silicide.

Overlying the devices (e.g., transistor 220) on substrate 210 in FIG. 2 is interlayer dielectric 245. On interlayer dielectric 245 is patterned metal line (M1) that, in this embodiment, is source line 255. As shown, disposed between source line 255 and junction region 230 is conductive via 258. Representatively, conductive via 258 is, for example, tungsten and source line 255 is, for example, copper. In one embodiment, conductive via 258 and source line 255 may be formed, for example, by a Damascene technique.

FIG. 2 also shows interlayer dielectric 259 overlying the first metal line (source line 255) and patterned second metal line 260 formed on a surface of interlayer dielectric 259. FIG. 2 also shows pillar contact 285 extending through interlayer dielectric 259 and interlayer dielectric 245 to junction region 240 of transistor 220. In one embodiment, pillar contact 285 is a conductive material, such as copper or tungsten that is disposed in dielectric material (interlayer dielectric 245 and interlayer dielectric 259) and does not come in contact with the first metal layer (source line 255). Representatively, pillar contact 285 is self-aligned to source line 255. Representatively, pillar contact 285 and second metal line 260 are formed by a Damascene technique.

Also disposed on a surface of interlayer dielectric 259 at a second metal line layer in structure 200 is optional redistribution layer 280. In one embodiment, redistribution layer 280 has an area defined by length, l, and width into and out of the page that is greater than a cross-sectional area through an end of pillar contact 285. As illustrated, an end of pillar contact 285 contacts an area of a base of redistribution layer 280 while an opposite end contacts junction region 240 of access transistor 220. Connected to an opposite side of redistribution layer 280 is STT-MRAM memory element 275. In one embodiment, STT-MRAM memory element 275 is a magneto-tunnel-junction (MTJ) memory device within an STT-MRAM bit cell such as described above with reference to FIG. 1. Overlying STT-MRAM memory component 275 is a third layer of metal including bit line 270 of, for example, copper.

To form the MTJ device shown in FIG. 1 and FIG. 2 (MTJ device 1101), the individual layers of the device may be introduced onto substrate 210 by, for example, a deposition process (e.g., physical vapor deposition (PVD)). The deposition process begins with, for example, the deposition of a buffer material (buffer layer 1103). A suitable buffer material is aluminum that may be deposited by way of PVD under a representative deposition pressure of about 1 mtorr to a thickness on the order of 3 Å to 10 Å (e.g., 5 Å). Following deposition of the aluminum, the aluminum is oxidized by exposing the layer of aluminum to oxygen. A representative oxidation process is on the order of 2 mtorr of oxygen for two minutes. The deposited aluminum is amorphous meaning that it lacks a characteristic of a crystal.

Following the deposition and oxidation of the amorphous aluminum buffer layer, the synthetic antiferromagnetic layer, fixed magnetic layer, tunneling or dielectric layer and free magnetic layer are deposited in that order.

Figure 3:
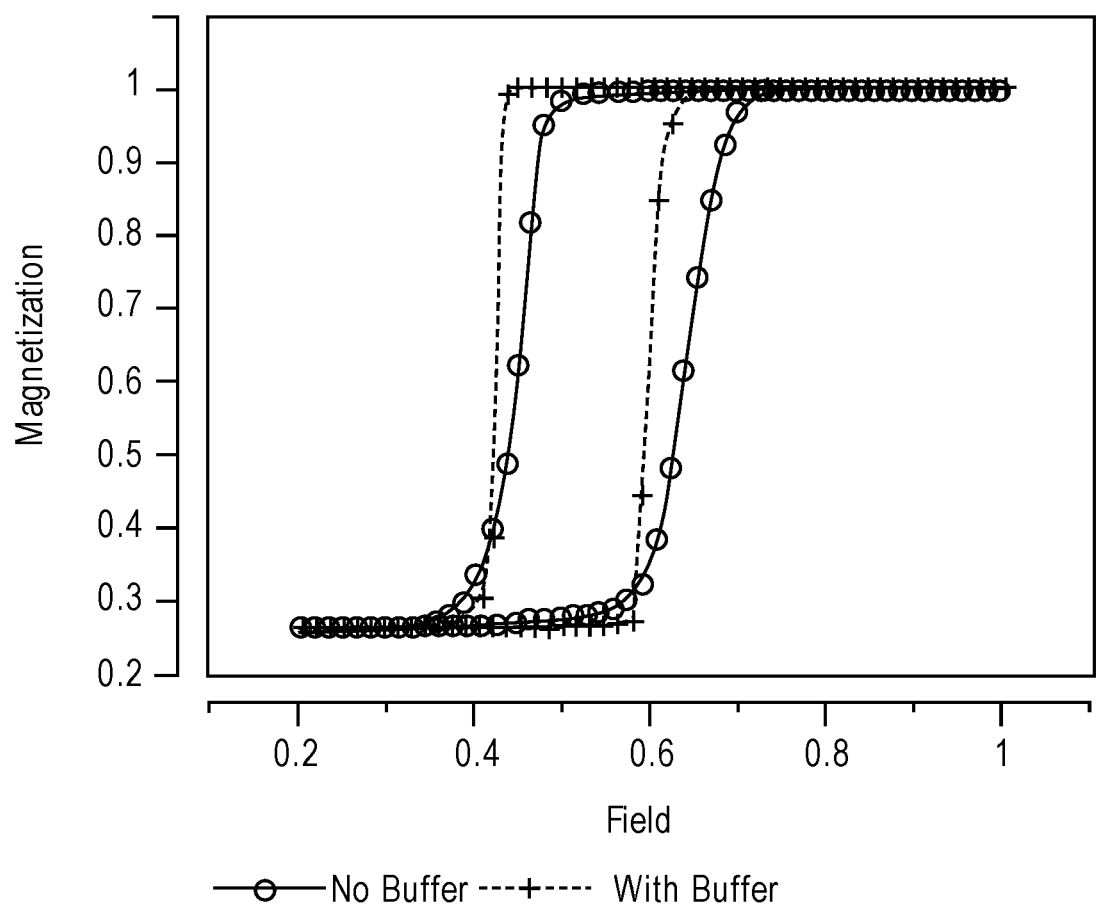
FIG. 3 shows a graph of magnetization versus a magnetic field for an MTJ device with a buffer layer between a bottom electrode and a synthetic antiferromagnetic layer and an MTJ device without a buffer layer.

FIG. 3 shows that inserting a buffer layer of, for example, oxidized amorphous aluminum between a bottom electrode and a synthetic antiferromagnetic layer leads to an increase in perpendicular magnetic anisotrophy of a synthetic anti-ferromagnetic layer of an MTJ device by approximately 20 percent over a similar device with no buffer layer. Increasing the perpendicular magnetic anisotrophy leads to an increase in device switching yield of approximately 30 to 80 percent.

Figure 4:
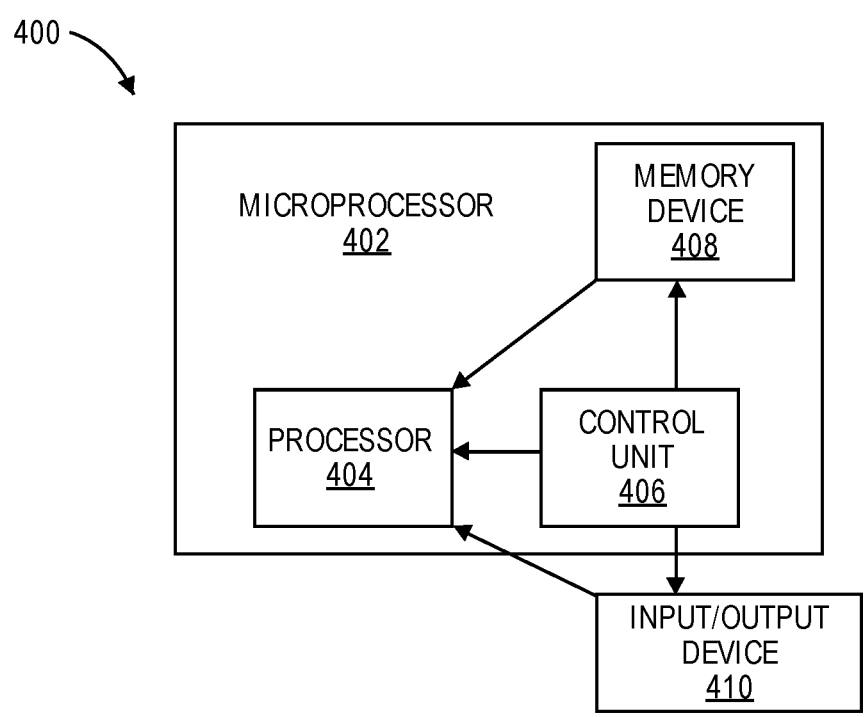
FIG. 4 illustrates a block diagram of an embodiment of an electronic system.

FIG. 4 illustrates a block diagram of an embodiment of electronic system 400. Electronic system 400 can correspond to, for example, a portable system, a computer system, a process control system, or any other system that utilizes a processor and an associated memory. In this embodiment, electronic system 400 includes microprocessor 402 (having processor 404 and control unit 406), memory device 408, and input/output device 410 (it is to be understood that electronic system 400 may have a plurality of processors, control units, memory device units and/or input/output devices in various embodiments). In one embodiment, electronic system 400 has a set of instructions that defines operations which are to be performed on data by processor 404, as well as, other transactions between processor 404, memory device 408, and input/output device 410. Control unit 406 coordinates the operations of processor 404, memory device 408 and input/output device 410 by cycling through a set of operations that cause instructions to be retrieved from memory device 408 and executed. Memory device 408 can include element such as a STT-MRAM element as described herein, or other types of volatile and non-volatile memory components. In an embodiment, memory device 408 is embedded in microprocessor 402.

Figure 5:
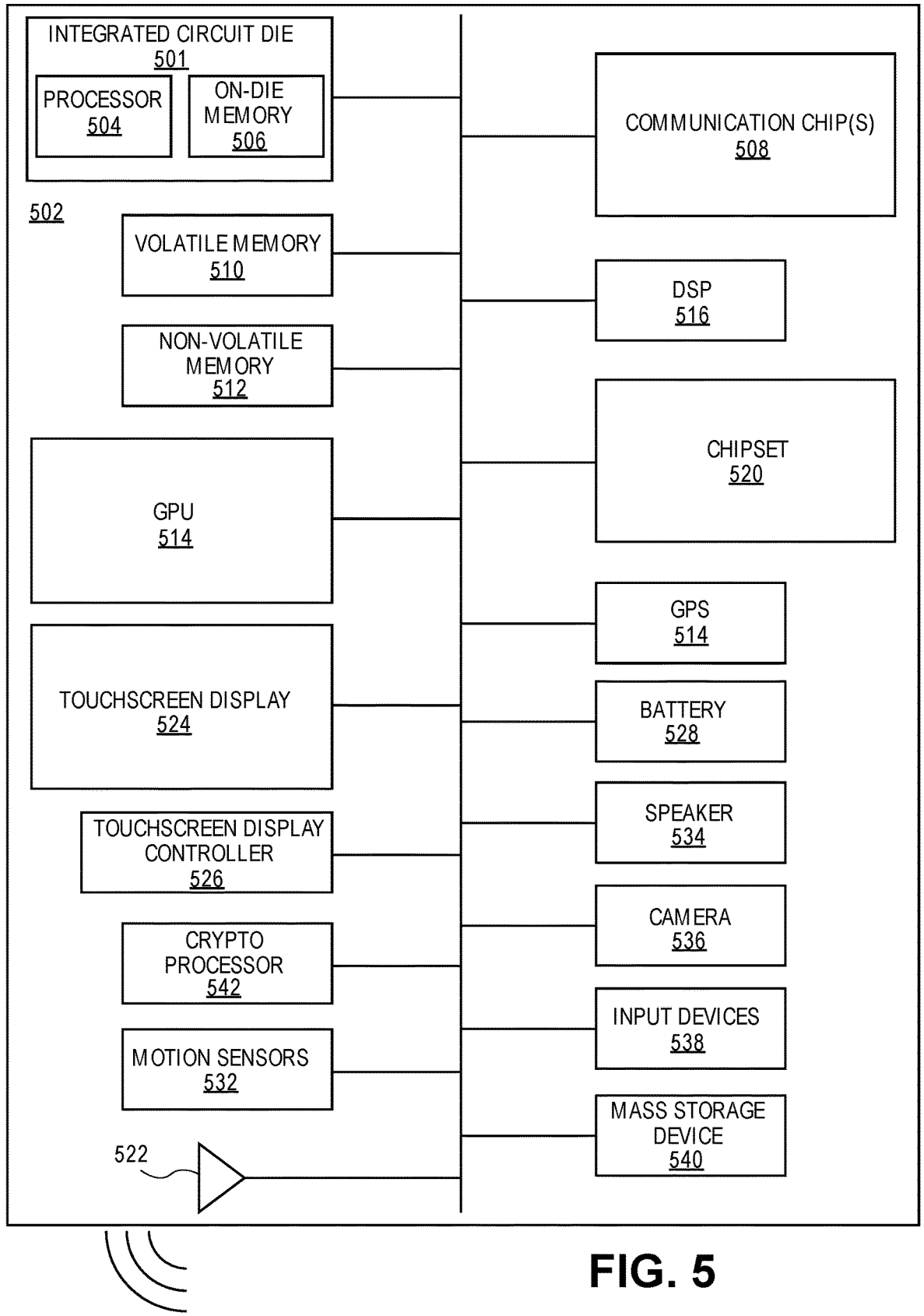
FIG. 5 illustrates an embodiment of a computing device.

FIG. 5 illustrates computing device 500 in accordance with one implementation. Computing device 500 houses board 502. Board 502 may include a number of components, including but not limited to processor 504 and at least one communication chip 508. Processor 504 is physically and electrically connected to board 502. In some implementations the at least one communication chip 508 is also physically and electrically coupled to board 502. In further implementations, communication chip 508 is part of processor 504.

Depending on its applications, computing device 500 may include other components that may or may not be physically and electrically coupled to board 502. These other components include, but are not limited to, volatile memory 510 (e.g., DRAM), non-volatile memory 512 (e.g., ROM), flash memory, a graphics processor (graphics processing unit 514), digital signal processor 516, crypto processor 542, chipset 520, antenna 522, a display, touchscreen display 524, touchscreen controller 526, battery 528, an audio codec, a video codec, a power amplifier, global positioning system (GPS) device 514, a compass, accelerometer motion sensors 542, a gyroscope, speaker 534, camera 536, input devices 538 and mass storage device 540 (such as hard disk drive, compact disk (CD), digital versatile disk (DVD), and so forth).

Communication chip 508 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 504 of computing device 500 includes an integrated circuit die packaged within processor 504. In some implementations, the integrated circuit die of the processor includes one or more devices, such as on-die memory 506 (e.g., a non-volatile memory (e.g., a STT-MRAM memory). The term "processor" may refer to any device or portion of a device that processes electronic data from registers and/or memory to transform that electronic data into other electronic data that may be stored in registers and/or memory.

Communication chip 508 also includes an integrated circuit die packaged within communication chip 508. In accordance with another implementation of the invention, the integrated circuit die of the communication chip includes one or more devices, such as spin transfer torque memory built in accordance with implementations.

In further implementations, another component housed within computing device 500 may contain an integrated circuit die that includes one or more devices, such as non-volatile memory (e.g., STT-MRAM memory) built in accordance with implementations.

In various implementations, computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

Accordingly, one or more embodiments relate generally to the fabrication of microelectronic memory. The microelectronic memory may be non-volatile, wherein the memory can retain stored information even when not powered. One or more, embodiments of the present invention relate to the fabrication of a spin transfer torque memory element for non-volatile microelectronic memory devices. Such an element may be used in an embedded or standalone non-volatile memory, either for its non-volatility, or as a replacement for embedded and standalone dynamic random access memory (DRAM). For example, such an element may be used for 1T-1X memory (X=capacitor or resistor) at competitive cell sizes within a given technology node.

EXAMPLES

Example 1 is a magnetic tunneling junction (MTJ) device, including a free magnetic layer; a fixed magnetic layer; a tunneling layer disposed between the free magnetic layer and the fixed magnetic layer; and a buffer layer disposed on a side of the fixed magnetic layer opposite the tunneling layer.

In Example 2, the MTJ of Example 1 further includes a synthetic antiferromagnetic layer between the fixed magnetic layer and the buffer layer.

In Example 3, the buffer layer of the MTJ device of Example 1 or 2 includes an oxidized aluminum layer.

In Example 4, the buffer layer of the MTJ device of Example 3 is amorphous.

In Example 5, a thickness of the buffer layer of the MTJ device of Example 3 or 4 is between 3 angstroms and 10 angstroms.

In Example 6, the MTJ device of Examples 1-5 is coupled to an electrode such that the buffer layer is disposed between the synthetic antiferromagnetic layer and the electrode and the buffer layer includes a property that inhibits a propagation of a crystalline structure of the electrode into the antiferromagnetic layer.

In Example 7, the electrode of the MTJ device of Example 6 is a first electrode and wherein the MTJ device is coupled to a second electrode such that the MTJ device is between the first electrode and the second electrode.

Example 8 is a non-volatile memory device, including a first electrode; a fixed magnetic layer disposed on the first electrode; a free magnetic layer disposed on the fixed magnetic layer; a tunneling layer disposed between the free magnetic layer and the fixed magnetic layer; a buffer layer including a material layer disposed on a side of the fixed magnetic layer opposite the tunneling layer; a second electrode disposed on the buffer layer; and a transistor electrically connected to the first or the second electrode, a source line, and a word line.

In Example 9, the non-volatile memory device of Example 8 further includes a synthetic antiferromagnetic layer between the fixed magnetic layer and the buffer layer.

In Example 10, the buffer layer of the non-volatile device of Example 8 includes an oxidized aluminum layer.

In Example 11, the buffer layer of the non-volatile device of Example 10 is amorphous.

In Example 12, a thickness of the buffer layer of the non-volatile device of Example 10 is between 3 angstroms and 10 angstroms.

In Example 13, a mobile computing platform includes the non-volatile memory device of Example 8, a display screen; and a wireless transceiver.

Example 14 is a method of forming a magnetic tunneling junction (MTJ), including depositing a buffer layer on a first electrode, wherein the buffer layer includes a property that inhibits a propagation of a crystalline structure of the first electrode into the antiferromagnetic layer; depositing a fixed magnetic layer on the buffer layer; depositing a tunneling layer on the fixed magnetic layer; and depositing a free magnetic layer on the tunneling layer.

In Example 15, prior to depositing the fixed magnetic layer, the method of Example 14 includes depositing a synthetic antiferromagnetic layer on the buffer layer.

In Example 16, the buffer layer of the method of Example 14 or 15 includes aluminum.

In Example 17, the aluminum of the method of Example 16 is amorphous.

In Example 18, depositing the buffer layer of the method of Example 16 or 17 includes depositing a layer including aluminum and oxidizing the layer.

In Example 19, the buffer layer of the method of any of Examples 16-18 is deposited to a thickness of 3 angstroms to 10 angstroms.

In Example 20, the method of any of Examples 14-19, further includes coupling the free magnetic layer to a second electrode.

In Example 21, a magnetic tunneling junction (MTJ) device made by any of the methods of Examples 14-20.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

The invention claimed is:

1. A magnetic tunneling junction (MTJ) device, comprising:
   a free magnetic layer;
   a fixed magnetic layer;
   a tunneling layer disposed between the free magnetic layer and the fixed magnetic layer; and
   a buffer layer disposed on a side of the fixed magnetic layer opposite the tunneling layer, wherein the buffer layer comprises an oxidized aluminum layer.

2. The MTJ of claim 1, further comprising a synthetic antiferromagnetic layer between the fixed magnetic layer and the buffer layer.

3. The MTJ device of claim 1, wherein the buffer layer is amorphous.

4. The MTJ device of claim 1, wherein a thickness of the buffer layer is between 3 angstroms and 10 angstroms.

5. The MTJ device of claim 1, wherein the MTJ device is coupled to an electrode such that the buffer layer is disposed between the synthetic antiferromagnetic layer and the electrode and the buffer layer comprises a property that inhibits a propagation of a crystalline structure of the electrode into the antiferromagnetic layer.

6. The MTJ device of claim 5, wherein the electrode is a first electrode and wherein the MTJ device is coupled to a second electrode such that the MTJ device is between the first electrode and the second electrode.

7. A non-volatile memory device, comprising:
   a first electrode;
   a fixed magnetic layer disposed on the first electrode;
   a free magnetic layer disposed on the fixed magnetic layer;
   a tunneling layer disposed between the free magnetic layer and the fixed magnetic layer;
   a buffer layer including a material layer disposed on a side of the fixed magnetic layer opposite the tunneling layer, wherein the buffer layer comprises an oxidized aluminum layer;
   a second electrode disposed on the buffer layer; and
   a transistor electrically connected to the first or the second electrode, a source line, and a word line.

8. The non-volatile memory device of claim 7, further comprising a synthetic antiferromagnetic layer between the fixed magnetic layer and the buffer layer.

9. The non-volatile memory device of claim 7, wherein the buffer layer is amorphous.

10. The non-volatile memory device of claim 7, wherein a thickness of the buffer layer is between 3 angstroms and 10 angstroms.

11. A mobile computing platform comprising:
    the non-volatile memory device of claim 7, a display screen; and
    a wireless transceiver.

12. A method of forming a magnetic tunneling junction (MTJ), comprising:
    depositing a buffer layer on a first electrode, wherein the buffer layer comprises a property that inhibits a propagation of a crystalline structure of the first electrode into the antiferromagnetic layer, wherein the buffer layer comprises aluminum;
    depositing a fixed magnetic layer on the buffer layer;
    depositing a tunneling layer on the fixed magnetic layer; and
    depositing a free magnetic layer on the tunneling layer.

13. The method of claim 12, wherein prior to depositing the fixed magnetic layer, the method comprises depositing a synthetic antiferromagnetic layer on the buffer layer.

14. The method of claim 12, wherein the aluminum is amorphous.

15. The method of claim 12, wherein depositing the buffer layer comprises depositing a layer comprising aluminum and oxidizing the layer.

16. The method of claim 12, wherein the buffer layer is deposited to a thickness of 3 angstroms to 10 angstroms.

17. The method of claim 12, further comprising coupling the free magnetic layer to a second electrode.

\* \* \* \* \*